(12) United States Patent
Tamura et al.

(10) Patent No.: US 8,450,613 B2
(45) Date of Patent: May 28, 2013

(54) SUSPENSION BOARD WITH CIRCUIT AND PRODUCTION METHOD THEREOF

(75) Inventors: Yasushi Tamura, Osaka (JP); Ryouji Suezaki, Osaka (JP); Tetsuya Ohsawa, Osaka (JP); Hiroyuki Tanabe, Osaka (JP); Hitoki Kanagawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 360 days.

(21) Appl. No.: 12/659,291

(22) Filed: Mar. 3, 2010

(65) Prior Publication Data

US 2010/0224391 A1 Sep. 9, 2010

Related U.S. Application Data

(60) Provisional application No. 61/202,583, filed on Mar. 16, 2009.

(30) Foreign Application Priority Data

Mar. 5, 2009 (JP) .................. 2009-052200

(51) Int. Cl.
*H05K 1/00* (2006.01)

(52) U.S. Cl.
USPC ........................................................ 174/250

(58) Field of Classification Search
USPC .......... 174/250, 253–255, 258, 261; 361/728, 361/748–751, 777, 778
See application file for complete search history.

(56) References Cited

U.S. PATENT DOCUMENTS

| | | | |
|---|---|---|---|
| 5,604,081 A | 2/1997 | Stoll | |
| 2002/0172443 A1* | 11/2002 | Muraki et al. | 384/537 |
| 2007/0242390 A1 | 10/2007 | Okada et al. | |
| 2008/0277147 A1* | 11/2008 | Mizushima et al. | 174/255 |

FOREIGN PATENT DOCUMENTS

| | | |
|---|---|---|
| JP | 57-109331 A | 7/1982 |
| JP | 11-061447 A | 3/1993 |
| JP | 6-244139 | 9/1994 |
| JP | 2002-151833 A | 5/2002 |
| JP | 2003-068610 A | 3/2003 |
| JP | 2003-317217 A | 11/2003 |
| JP | 2003-322975 A | 11/2003 |
| JP | 2005-078688 A | 3/2005 |
| JP | 2007-164968 | 6/2007 |
| JP | 2007-287234 A | 11/2007 |

\* cited by examiner

*Primary Examiner* — Jeremy Norris
*Assistant Examiner* — Tremesha S Willis
(74) *Attorney, Agent, or Firm* — Jean C. Edwards, Esq.; Edwards Neils PLLC

(57) ABSTRACT

A suspension board with circuit includes a metal supporting board, an insulating base layer formed on the metal supporting board, a conductive pattern formed on the insulating base layer, an insulating cover layer formed on the insulating base layer so as to cover the conductive pattern, and an insertion portion to be inserted into an E-block. A thickness of the insulating cover layer in the insertion portion is larger than a thickness of the insulating cover layer in a portion other than the insertion portion.

2 Claims, 6 Drawing Sheets

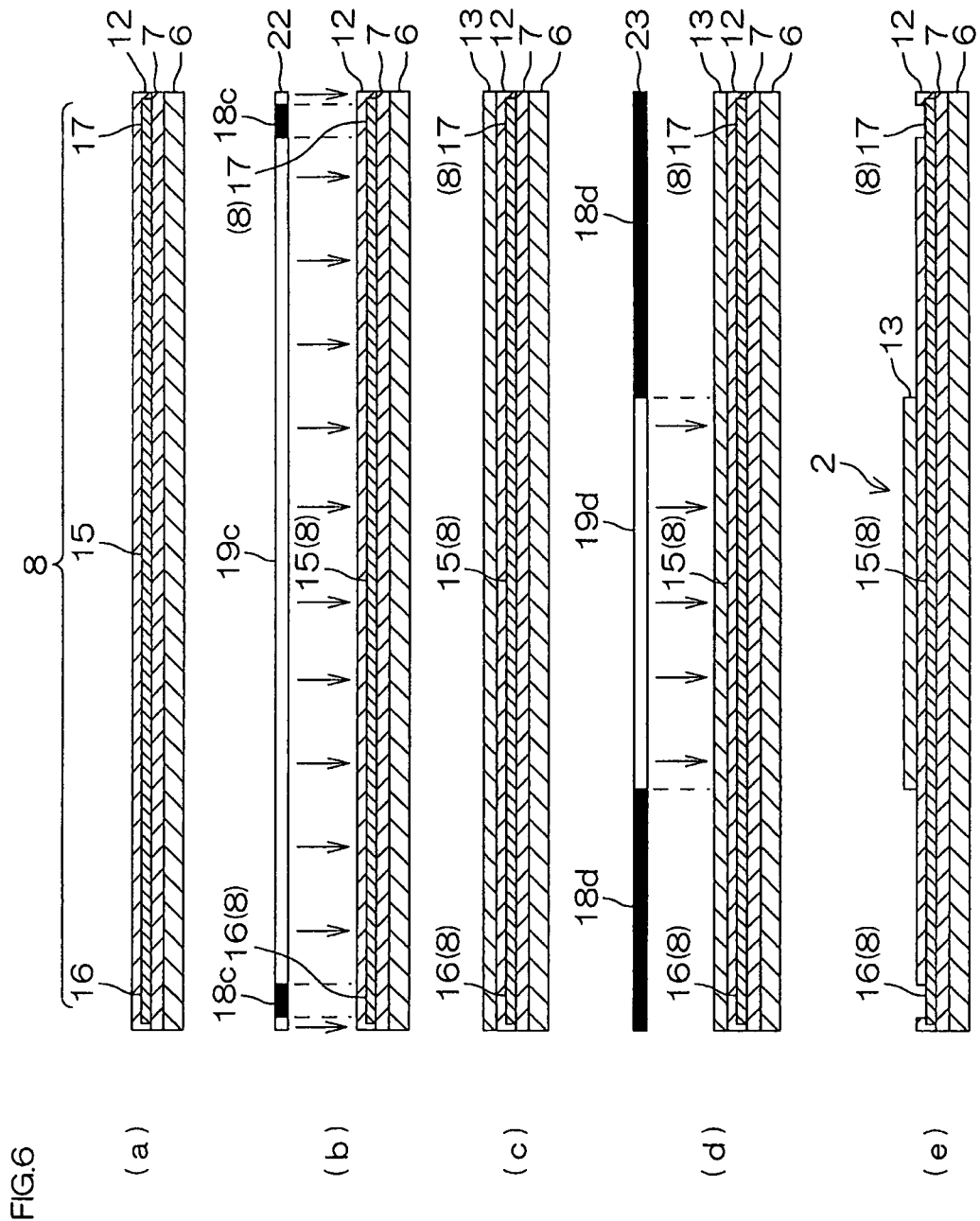

SUSPENSION BOARD WITH CIRCUIT AND PRODUCTION METHOD THEREOF

CROSS-REFERENCE TO RELATED APPLICATIONS

This patent application claims the benefit of U.S. Provisional Application No. 61/202,583, filed on Mar. 16, 2009, and claims priority from Japanese Patent Application No. 2009-052200, filed on Mar. 5, 2009, the contents of which are herein incorporated by reference in their entirety.

BACKGROUND OF THE INVENTION

1. Field of the Invention

The present invention relates to a suspension board with circuit and a producing method thereof and, more particularly, to a suspension board with circuit mounted in a hard disk drive and a producing method thereof.

2. Description of the Related Art

Conventionally, in a suspension board with circuit, an insulating base layer, a conductive pattern, and an insulating cover layer are laminated in succession on a metal supporting board. Typically, the suspension board with circuit is mounted in a comb-shaped E-block in a hard disk drive.

For example, it has been proposed that, in a head stack assembly (HSA) provided in a hard disk drive, a plurality of head gimbal assemblies (HGAs) each having a flexure are mounted in an E-block (see, e.g., Japanese Unexamined Patent No. 2007-164968).

SUMMARY OF THE INVENTION

The HGAs are inserted into spaces in the E-block, and mounted therein. However, because an insulating cover layer of the flexure of each of the HGAs is made of an insulating material, the insulating cover layer is damaged during the insertion of the HGA. In some cases, a conductive pattern exposed from the damaged insulating cover layer may also be damaged or incur a broken wire.

It is therefore an object of the present invention to provide a suspension board with circuit and a producing method thereof which can prevent damage to an insulating cover layer and a conductive pattern.

A suspension board with circuit of the present invention includes a metal supporting board, an insulating base layer formed on the metal supporting board, a conductive pattern formed on the insulating base layer, an insulating cover layer formed on the insulating base layer so as to cover the conductive pattern, and an insertion portion to be inserted into an E-block, wherein a thickness of the insulating cover layer in the insertion portion is larger than a thickness of the insulating cover layer in a portion other than the insertion portion.

In the suspension board with circuit, the insulating cover layer is formed such that the thickness thereof in the insertion portion is larger than the thickness thereof in the portion other than the insertion portion. Therefore, when the suspension board with circuit is inserted into the E-block, it is possible to effectively prevent damage to the insulating cover layer in the insertion portion, and further prevent damage to the conductive pattern and a broken wire therein each resulting from the damage to the insulating cover layer.

As a result, by mounting, in a hard disk drive, the suspension board with circuit in which damage to the conductive pattern in the insertion portion and a broken wire therein is prevented, the reliability of the hard disk drive can be improved.

A producing method of a suspension board with circuit according to an aspect of the present invention is a producing method of a suspension board with circuit including an insertion portion to be inserted into an E-block, which includes the steps of preparing a metal supporting board and an insulating base layer formed on the metal supporting board, forming a conductive pattern on the insulating base layer, and forming an insulating cover layer on the insulating base layer so as to cover the conductive pattern, wherein the step of forming the insulating cover layer includes forming a photosensitive layer on the insulating base layer and the conductive pattern, a first exposure step of disposing a first photomask so as to expose, to light, a portion of the photosensitive layer corresponding to the insertion portion, and shield, from light, the other portion of the photosensitive layer, and performing exposure, a second exposure step of disposing a second photomask so as to expose, to light, a portion of the photosensitive layer where the insulating cover layer including the insertion portion is formed, and shield, from light, the portion of the photosensitive layer where the insulating cover layer is not to be formed, and performing exposure, a development step of developing the photosensitive layer exposed to light by the first exposure step and the second exposure step to pattern the photosensitive layer such that a thickness of the photosensitive layer in the insertion portion is larger than a thickness of the photosensitive layer in a portion other than the insertion portion, and a curing step of curing the photosensitive layer after the development step.

In accordance with the method, due to the first exposure step and the second exposure step, the insulating cover layer can be formed such that the thickness thereof in the insertion portion is larger than the thickness thereof in the portion other than the insertion portion.

A producing method of a suspension board with circuit according to an aspect of the present invention is a producing method of a suspension board with circuit including an insertion portion to be inserted into an E-block, which includes the steps of preparing a metal supporting board and an insulating base layer formed on the metal supporting board, forming a conductive pattern on the insulating base layer, and forming an insulating cover layer on the insulating base layer so as to cover the conductive pattern, wherein the step of forming the insulating cover layer includes a first-photosensitive-layer forming step of forming a first photosensitive layer on the insulating base layer and the conductive pattern, a third exposure step of disposing a third photomask so as to expose, to light, a portion of the first photosensitive layer where the insulating cover layer including the insertion portion is formed, and shield, from light, a portion of the first photosensitive layer where the insulating cover layer is not to be formed, and performing exposure, a second-photosensitive-layer forming step of forming a second photosensitive layer on the first photosensitive layer after the third exposure step, a fourth exposure step of disposing a fourth photomask so as to expose, to light, a portion of the second photosensitive layer corresponding to the insertion portion, and shield, from light, the other portion of the second photosensitive layer, and performing exposure, a development step of developing the first photosensitive layer exposed to light by the third exposure step and the second photosensitive layer exposed to light by the fourth exposure step to pattern the first photosensitive layer and the second photosensitive layer such that a total thickness of the first photosensitive layer and the second photosensitive layer in the insertion portion is larger than a total thickness of the first photosensitive layer and the second photosensitive layer in a portion other than the insertion portion, and a curing step of curing each of the first photosensitive layer and the second photosensitive layer after the development step.

In accordance with the method, by the first-photosensitive-layer forming step and the second-photosensitive-layer forming step, the insulating cover layer is formed from two photosensitive layers which are the first photosensitive layer and the second photosensitive layer. This allows the insulating cover layer to be formed such that the thickness thereof in the insertion portion is larger than the thickness thereof in the portion other than the insertion portion.

BRIEF DESCRIPTION OF THE DRAWINGS

FIG. 6 is a process step view showing another embodiment of the producing method of the suspension board with circuit of the present invention, which illustrates the step of forming the insulating cover layer of FIG. 1(d),
  (a) showing the step of forming a first photosensitive layer,
  (b) showing the step of disposing a third photomask on the first photosensitive layer, and exposing the first photosensitive layer to light,
  (c) showing the step of forming a second photosensitive layer,
  (d) showing the step of disposing a fourth photomask on the second photosensitive layer, and exposing the second photosensitive layer to light, and
  (e) showing the step of developing the first photosensitive layer and the second photosensitive layer.

DETAILED DESCRIPTION OF THE INVENTION

Figure 1:
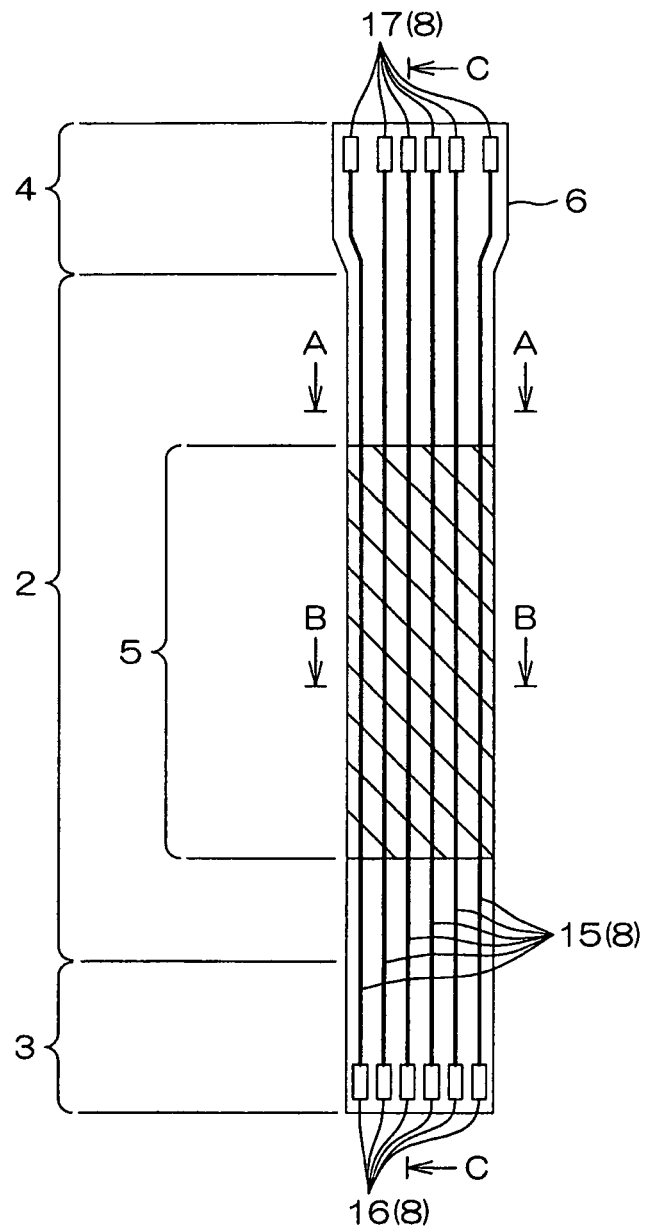
FIG. 1 is a plan view of an embodiment of a suspension board with circuit of the present invention.
Figure 2:
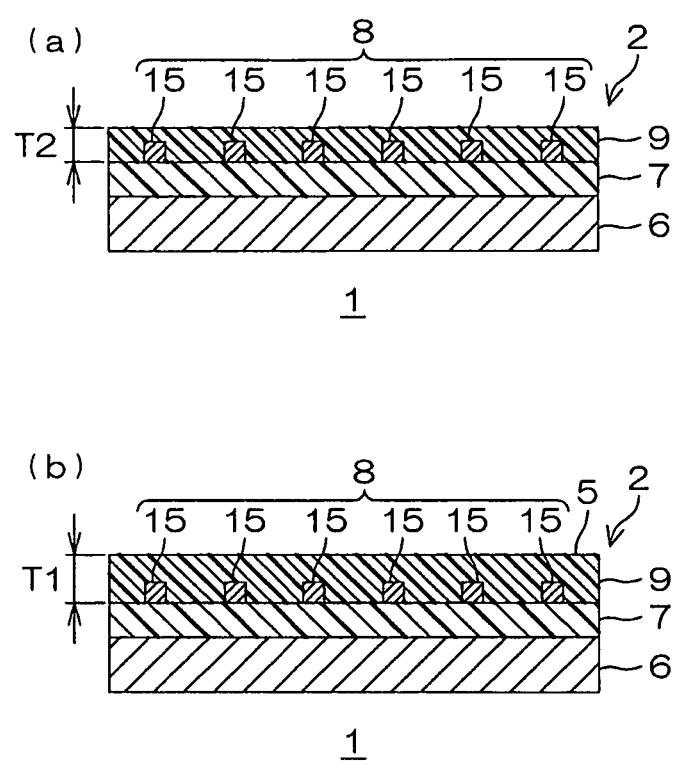
FIG. 2 is a cross-sectional view along a widthwise direction of the suspension board with circuit shown in FIG. 1,
  (a) showing a cross-sectional view along the line A-A, and
  (b) showing a cross-sectional view along the line B-B.
Figure 3:
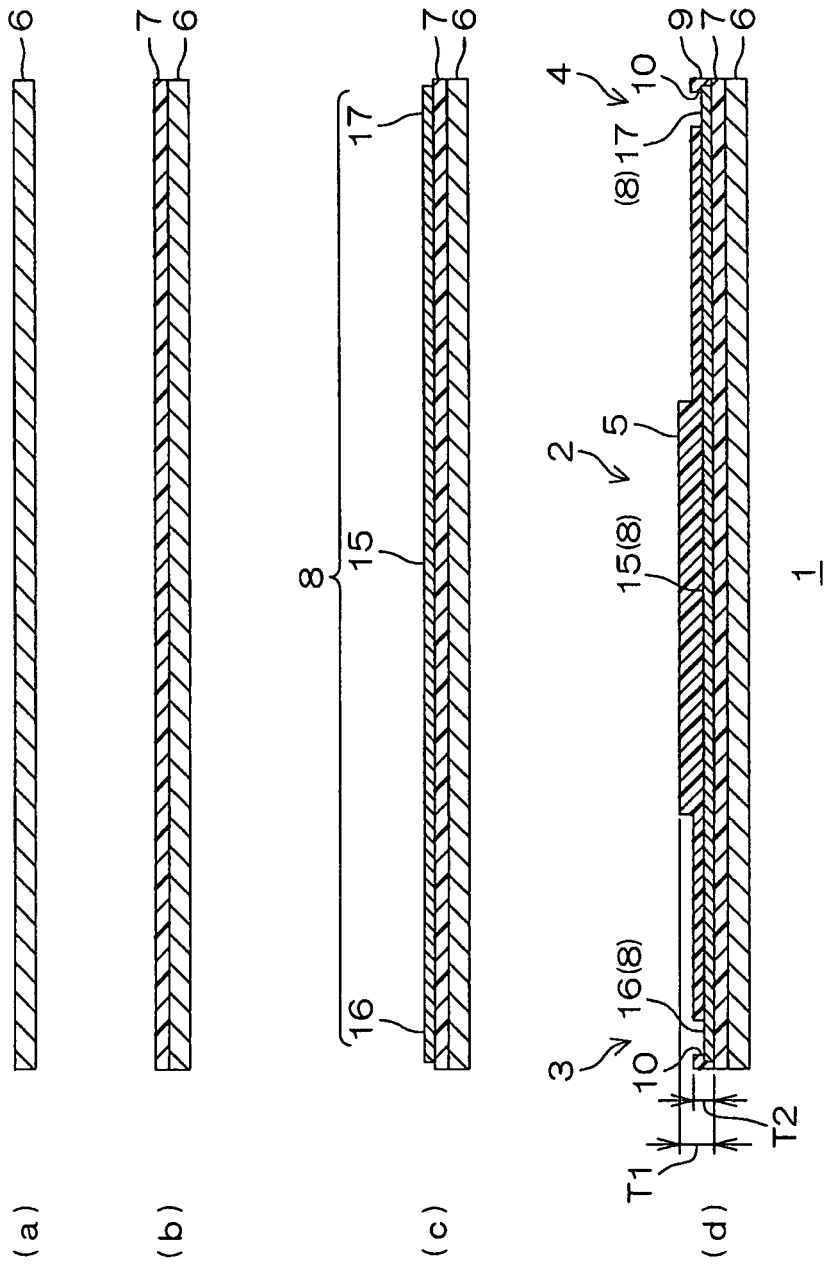
FIG. 3 is a production process view showing a producing method of the suspension board with circuit shown in FIG. 1, which is a cross-sectional view along the line C-C of FIG. 1,
  (a) showing the step of preparing a metal supporting board,
  (b) showing the step of forming an insulating base layer,
  (c) showing the step of forming a conductive pattern, and
  (d) showing the step of forming an insulating cover layer.
Figure 4:
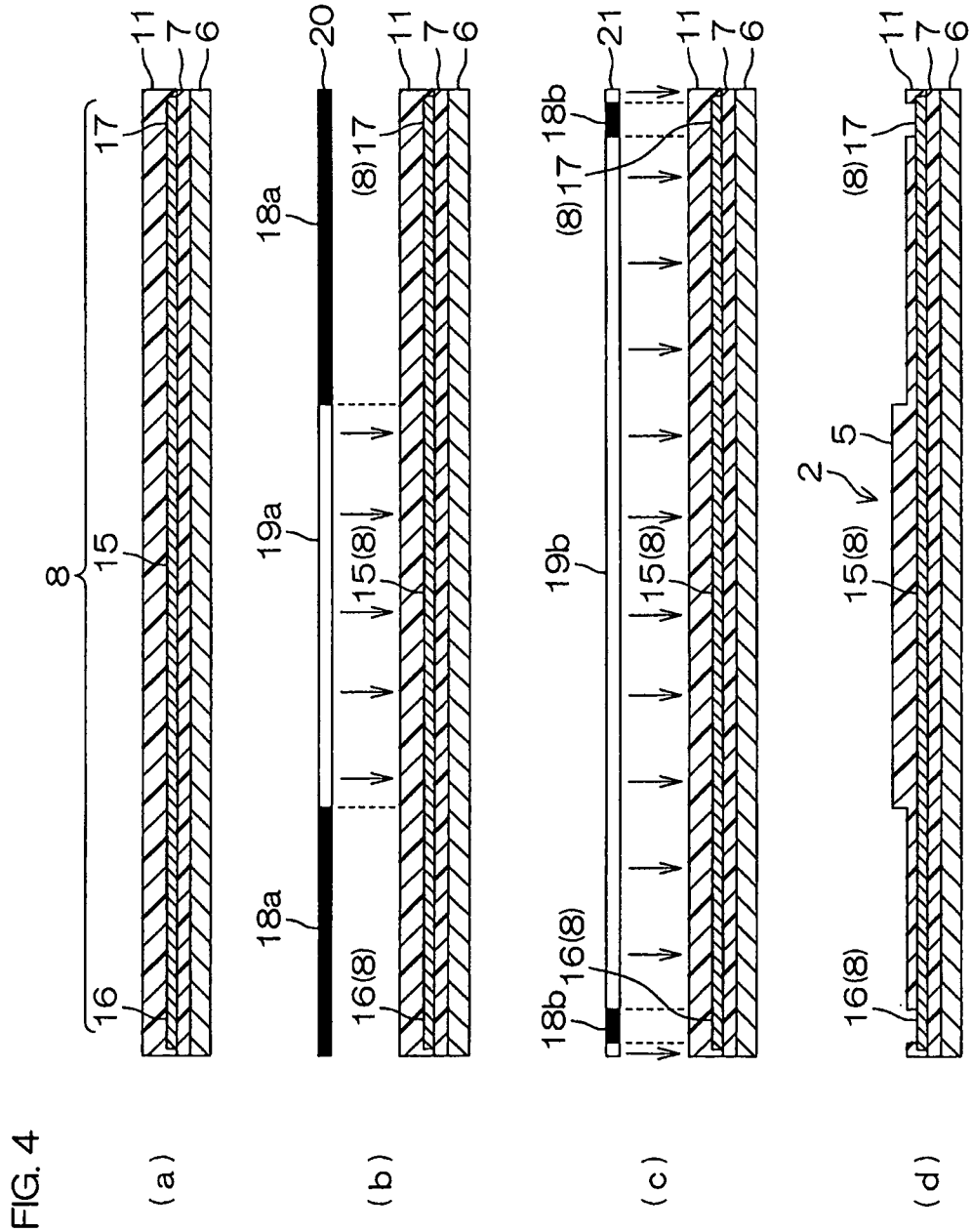
FIG. 4 is a production process view illustrating the step of forming the insulating cover layer of FIG. 3(d),
  (a) showing the step of forming a photosensitive layer,
  (b) showing the step of disposing a first photomask on the photosensitive layer, and exposing the photosensitive layer to light,
  (c) showing the step of disposing a second photomask on the photosensitive layer, and exposing the photosensitive layer to light, and
  (d) showing the step of developing the photosensitive layer.
Figure 5:
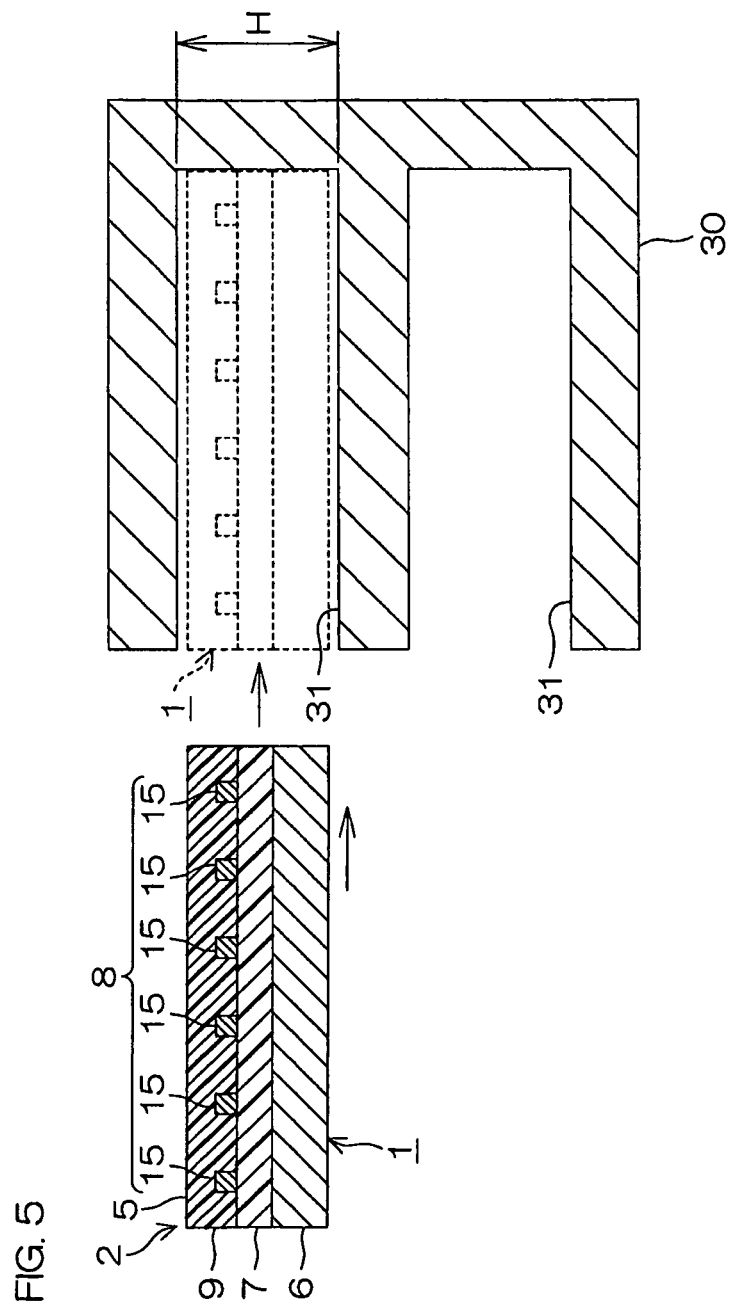
FIG. 5 is an illustrative view of a method of inserting the suspension board with circuit shown in FIG. 2(b) into an E-block.

FIG. 1 is a plan view of an embodiment of a suspension board with circuit of the present invention. FIG. 2 is a cross-sectional view along a widthwise direction (direction perpendicular to a longitudinal direction) of the suspension board with circuit shown in FIG. 1, (a) showing a cross-sectional view along the line A-A, and (b) showing a cross-sectional view along the line B-B. FIGS. 3 and 4 are production process views each showing a producing method of the suspension board with circuit shown in FIG. 1, which show cross-sectional views along the line C-C of FIG. 1. FIG. 5 is an illustrative view of a method of inserting the suspension board with circuit shown in FIG. 2(b) into an E-block.

Note that, in FIG. 1, an insulating base layer 7 and an insulating cover layer 9 are omitted for clear illustration of relative positioning of a conductive pattern 8 described later.

In FIG. 1, on a suspension board with circuit 1, a magnetic head (not shown) of a hard disk drive is mounted. The suspension board with circuit 1 supports the magnetic head, while holding a minute gap between the magnetic head and a hard disk (not shown), against an air flow when the magnetic head and the hard disk travel relatively to each other. In the suspension board with circuit 1, the conductive pattern 8 for electrically connecting an external circuit board (e.g., a read/write board) not shown and the magnetic head is formed on a metal supporting board 6.

As described later, the conductive pattern 8 integrally includes head-side terminals 16 for connecting to terminals of the magnetic head, external terminals 17 for connecting to terminals of the read/write board, and a plurality of wires 15 for connecting the head-side terminals 16 and the external terminals 17.

The suspension board with circuit 1 is formed in a generally rectangular flat-belt plan view shape extending in the longitudinal direction, and integrally includes a wire formation portion 2, a head-side-terminal formation portion 3, and an external-terminal formation portion 4.

The wire formation portion 2 is formed in a generally rectangular plan view shape extending to a front-to-rear direction (longitudinal direction). On the wire formation portion 2, a plurality of wires 15 extending along the longitudinal direction are arranged in parallel to be spaced apart from each other in the widthwise direction (direction perpendicular to the longitudinal direction, which holds true hereinafter).

The head-side-terminal formation portion 3 is disposed on the front side (on one longitudinal side, which holds true hereinafter) of the wire formation portion 2 in adjacent relation thereto. Specifically, the head-side-terminal formation portion 3 extends from the front-end edge of the wire formation portion 2 toward the front side, and is formed in a generally rectangular plan view shape having substantially the same width as that of the wire formation portion 2.

On the head-side terminal formation portion 3, the head-side terminals 16 electrically connected to the magnetic head not shown are formed. The head-side terminals 16 are arranged in parallel in widthwise spaced-apart relation on the head-side-terminal formation portion 3, and connected to the respective front ends of the plurality of wires 15.

The external-terminal formation portion 4 is disposed on the rear side (the other longitudinal side, which holds true hereinafter) of the wire formation portion 2. Specifically, the external terminal formation portion 4 extends from the rear-end edge of the wire formation portion 2 toward the rear side, and is formed in a generally rectangular plan view shape having a width slightly larger than that of the wire formation portion 2.

On the external-terminal formation portion 4, the external terminals 17 electrically connected to the read/write board not shown are formed. The external terminals 17 are arranged in parallel in widthwise spaced-apart relation on the external-terminal formation portion 4, and connected to the respective rear ends of the plurality of wires 15.

The suspension board with circuit 1 is also provided with an insertion portion 5 to be inserted into an E-block 30 described later (See FIG. 5) of the hard disk drive.

The insertion portion 5 is defined entirely along the widthwise direction as a region in a generally rectangular plan view shape disposed at a longitudinal midpoint in the wire formation portion 2, and extending in the longitudinal direction.

As shown in FIGS. 2(*a*) and 2(*b*), the suspension board with circuit 1 also includes the metal supporting board 6, the insulating base layer 7 formed on the metal supporting board 6, the conductive pattern 8 formed on the insulating base layer 7, and the insulating cover layer 9 formed on the insulating base layer 7 so as to cover the conductive pattern 8.

As shown in FIGS. 1, 2(*a*), and 2(*b*), the metal supporting board 6 is formed into a shape corresponding to the outer shape of the suspension board with circuit 1 including the insertion portion 5. The metal supporting board 6 has a thickness in a range of, e.g., 10 to 60 μm, or preferably 15 to 30 μm.

The insulating base layer 7 is formed on the upper surface of the metal supporting board 6 into a shape corresponding to the outer shape of the suspension board with circuit 1 including the insertion portion 5. Specifically, the insulating base layer 7 is formed in a pattern extending continuously among the wire formation portion 2 including the insertion portion 5, the head-side-terminal formation portion 3, and the external-terminal formation portion 4. The insulating base layer 7 has a thickness in a range of, e.g., 1 to 30 μm, or preferably 2 to 20 μm.

The conductive pattern 8 is provided on the upper surface of the insulating base layer 7, and formed as a wired circuit pattern integrally including the head-side terminals 16, the external terminals 17, and the wires 15, as described above.

The dimensions of the conductive pattern 8 are as follows. That is, the width of each of the wires 15 is in a range of, e.g., 10 to 500 μm, or preferably 30 to 200 μm, and the spacing between the individual wires 15 is in a range of, e.g., 10 to 500 μm, or preferably 30 to 200 μm. The respective widths of the head-side terminals 16 and the external terminals 17 are in a range of, e.g., 20 to 1000 μm, or preferably 30 to 800 μm, and the respective spacings between the individual head-side terminals 16 and the external terminals 17 are in a range of, e.g., 20 to 1000 μm, or preferably 30 to 800 μm.

The conductive pattern 8 has a thickness in a range of, e.g., 5 to 20 μm, or preferably 5 to 15 μm.

As shown in FIGS. 2(*a*) and 2(*b*), the insulating cover layer 9 is provided on the upper surface of the conductive pattern 8 and on the upper surface of the insulating base layer 7 exposed from the conductive pattern 8. Specifically, the insulating cover layer 9 is formed in a pattern covering the wires 15 in the wire formation portion 2, and exposing the head-side terminals 16 and the external terminals 17 in the head-side-terminal formation portion 3 and in the external-terminal formation portion 4. As shown in FIG. 3(*d*), in the portions of the insulating cover layer 9 corresponding to the head-side terminals 16 and the external terminals 17, cover openings 10 are formed to extend through the insulating cover layer 9 in the thickness direction thereof, and expose the respective upper surfaces of the head-side terminals 16 and the external terminals 17.

The insulating cover layer 9 is formed such that a thickness T1 thereof in the insertion portion 5 is larger than a thickness T2 thereof in portions (the portions of the wire formation portion 2 which are located on both longitudinal sides of the insertion portion 5, the head-side-terminal formation portion 3, and the external-terminal formation portion 4) other than the insertion portion 5.

That is, the thickness T1 of the insulating cover layer 9 in the insertion portion 5 is larger than the thickness T2 thereof in the portions other than the insertion portion 5 by a value of not less than 50%, or preferably not less than 60%, specifically by a value of not less than 2.5 μm, or preferably not less than 3 μm.

The thickness T1 of the insulating cover layer 9 in the insertion portion 5 is in a range of, e.g., 6 to 10 μm, preferably 7 to 9 μm, or more preferably 7.5 to 8.5 μm, while the thickness T2 of the insulating cover layer 9 in the portions other than the insertion portion 5 is in a range of, e.g., 3 to 7 μm, preferably 4 to 6 μm, or more preferably 4.5 to 5.5 μm.

Next, a producing method of the suspension board with circuit 1 is described with reference to FIGS. 3 and 4.

First, in the method, as shown in FIGS. 3(*a*) and 3(*b*), the metal supporting board 6 and the insulating base layer 7 formed on the metal supporting board 6 are prepared.

To prepare the metal supporting board 6 and the insulating base layer 7, for example, the metal supporting board 6 is prepared first as shown in FIG. 3(*a*), and then the insulating base layer 7 is formed on the metal supporting board 6 as shown in FIG. 3(*b*).

Examples of a metal material used to form the metal supporting board 6 include stainless steel, a 42-alloy, and the like. Preferably, stainless steel is used.

Examples of an insulating material used to form the insulating base layer 7 include synthetic resins such as polyimide, polyamideimide, acryl, polyether nitrile, polyether sulfone, polyethylene terephthalate, polyethylene naphthalate, polyvinyl chloride, and a fluorine resin. Preferably, polyimide is used.

To form the insulating base layer 7 on the metal supporting board 6 using polyimide, for example, a varnish (polyamic acid resin solution) of a polyimide resin precursor is first uniformly coated on the entire upper surface of the metal supporting board 6, and dried by heating at a temperature in a range of, e.g., 70 to 130° C. to form a base coating. Then, the base coating is cured (imidized) by heating at a temperature of not less than 300° C. to form the insulating base layer 7.

The insulating base layer 7 can also be formed using photosensitive polyimide. That is, after the formation of the base coating, the base coating is exposed to light via a photomask, developed, subjected to post-exposure heating as necessary, and then cured by heating to be formed into a pattern.

Alternatively, it is also possible to prepare the metal supporting board 6 and the insulating base layer 7 shown in FIG. 3(*b*) by preparing a two-layer base material in which the insulating base layer 7 is laminated in advance on the metal supporting board 6, though not shown.

Next, as shown in FIG. 3(*c*), the conductive pattern 8 is formed on the insulating base layer 7.

Examples of a conductive material used to form the conductive pattern 8 include copper, nickel, gold, a solder, and an alloy thereof. Preferably, copper is used.

The conductive pattern 8 is formed by a known patterning method such as an additive method or a subtractive method. Preferably, the conductive pattern 8 is formed by the additive method.

In the additive method, a conductive thin film (seed film not shown) is first formed on the entire upper surface of the insulating base layer 7. The conductive thin film is formed by successively laminating a chromium thin film and a copper thin film by sputtering, or preferably by chromium sputtering and copper sputtering.

Next, on the upper surface of the conductive thin film, a plating resist (not shown) is formed in a pattern reverse to the conductive pattern 8. Then, on the upper surface of the conductive thin film exposed from the plating resist, the conductive pattern 8 is formed by electrolytic plating. Thereafter, the plating resist and the portion of the conductive thin film where the plating resist is laminated is removed.

Next, as shown in FIG. 3(d), the insulating cover layer 9 is formed on the insulating base layer 7 so as to cover the conductive pattern 8.

To form the insulating cover layer 9, as shown in FIG. 4(a), a photosensitive layer 11 is formed on the insulating base layer 7 and the conductive pattern 8 (photosensitive-layer forming step).

Examples of a photosensitive material used to form the photosensitive layer 11 include a photosensitive synthetic resin (synthetic resin forming the insulating base layer 7 shown above). Preferably, a photosensitive polyamic acid resin is used.

The photosensitive polyamic acid resin contains, e.g., a polyamic acid resin and a photosensitizer.

To form the photosensitive layer 11 from the photosensitive polyamic acid resin, for example, a photosensitive resin solution (varnish) in which the photosensitive polyamic acid resin is dissolved in an organic solvent such as N-methyl-2-pyrrolidone (NMP) is prepared first. Then, the prepared photosensitive varnish is coated on the insulating base layer 7 and the conductive pattern 8, and then dried by heating.

Alternatively, the photosensitive layer 11 made of the photosensitive polyamic acid resin, and formed into a sheet-like shape in advance is pressure-bonded onto the insulating base layer 7 and the conductive pattern 8.

The photosensitive layer 11 thus formed has a thickness in a range of, e.g., 7 to 15 µm, preferably 8 to 12 µm, or more preferably 9 to 11 µm.

Next, as shown in FIG. 4(b), a first photomask 20 is disposed over the photosensitive layer 11, and the photosensitive layer 11 is exposed to light via the first photomask 20 (first exposure step).

The first photomask 20 is disposed over the photosensitive layer 11 to be spaced apart therefrom.

The first photomask 20 has light shielding portions 18a which do not transmit light, and a light transmitting portion 19a which transmits light.

The first photomask 20 is disposed such that the light transmitting portion 19a faces the portion of the photosensitive layer 11 where the insulating cover layer 9 of the insertion portion 5 is to be formed, and the light shielding portions 18a face the portions of the photosensitive layer 11 other than the insertion portion 5.

That is, the first photomask 20 is disposed such that the portion of the photosensitive layer 11 where the insulating cover layer 9 of the insertion portion 5 is to be formed is exposed to light, and the portions of the photosensitive layer 11 other than the insertion portion 5 are shielded from light.

Subsequently, from above the first photomask 20, light is emitted toward the photosensitive layer 11 to expose the photosensitive layer 11 via the first photomask 20.

Examples of irradiation light used for exposure in the first exposure step include visible light, an ultraviolet beam, an infrared beam, an X-ray beam, an α-ray beam, a β-ray beam, and a γ-ray beam. Preferably, the ultraviolet beam is used. More specifically, the ultraviolet beam is emitted using a light source such as a low-pressure mercury lamp, a high-pressure mercury lamp, or a super-high-pressure mercury lamp.

The dose of the irradiation light is in a range of, e.g., 100 to 1500 $mJ/cm^2$, or preferably 200 to 1000 $mJ/cm^2$.

Next, as shown in FIG. 4(c), a second photomask 21 is disposed over the photosensitive layer 11 exposed to light by the first exposure step, and the photosensitive layer 11 is exposed to light via the second photomask 21 (second exposure step).

The second photomask 21 is disposed over the photosensitive layer 11 exposed to light by the first exposure step to be spaced apart therefrom.

The second photomask 21 includes light shielding portions 18b which do not transmit light, and a light transmitting portion 19b which transmits light.

The second photomask 21 is disposed such that the light transmitting portion 19b faces the portion of the photosensitive layer 11 where the insulating cover layer 9 including the insertion portion 5 is to be formed, and the light shielding portions 18b face the portions of the photosensitive layer 11 where the insulating cover layer 9 is not to be formed (portions where the cover openings 10 are to be formed).

That is, the second photomask 21 is disposed such that the portion of the photosensitive layer 11 where the insulating cover layer 9 including the insertion portion 5 is to be formed is exposed to light, and the portions of the photosensitive layer 11 where the insulating cover layer 9 is not to be formed (where the cover openings 10 are to be formed) are shielded from light.

Subsequently, from above the second photomask 21, light is emitted toward the photosensitive layer 11 exposed to light by the first exposure step, and exposes the photosensitive layer 11 via the second photomask 21.

As irradiation light used for exposure in the second exposure step, the same irradiation light as used for exposure in the first exposure step is used. The dose of the irradiation light in the second exposure step is selected appropriately in accordance with the thickness T2 of the insulating cover layer 9 in the portions other than the insertion portion 5, which is in a range of, e.g., 10 to 10000 $mJ/cm^2$, or preferably 200 to 1000 $mJ/cm^2$.

When the dose of the irradiation light in the second exposure step exceeds the range shown above, the thickness T2 of the insulating cover layer 9 in the portions other than the insertion portion 5 may be excessively increased, and unable to be sufficiently reduced with respect to the thickness T1 of the insulating cover layer 9 in the insertion portion 5.

When the dose of the irradiation light in the second exposure step is under the range shown above, the thickness T2 of the insulating cover layer 9 in the portions other than the insertion portion 5 is excessively reduced, and the insulating cover layer 9 may not be able to reliably cover the wires 15.

Next, as necessary, the photosensitive layer 11 exposed to light by the second exposure step is subjected to post-exposure heating (post-exposure heating step), though not shown.

Heating conditions for the post-exposure heating are such that a heating temperature is in a range of, e.g., 150 to 200° C., or preferably 175 to 185° C., and a heating time is in a range of, e.g., 1 to 10 minutes, or preferably 1 to 2 minutes.

By the first exposure step and the second exposure step (and the post-exposure heating step performed as necessary) described above, the solubility of the exposed portion facing each of the light transmitting portion 19a of the first photomask 20 and the light transmitting portion 19b of the second photomask 21 with respect to a developer is reduced. On the other hand, only the upper parts in the thickness direction of the portions (semi-exposed portions) facing each of the light shielding portions 18a of the first photomask 20 and the light transmitting portion 19b of the second photomask 21 are dissolved in the subsequent development step, while the unexposed portions facing each of the light shielding portions 18a of the first photomask 20 and the light shielding portions 18b of the second photomask 21 are dissolved in the subsequent development step, whereby a negative latent image is formed.

Next, as shown in FIG. 4(d), the photosensitive layer 11 exposed to light by the first exposure step and the second exposure step (and subjected to post-exposure heating by the post-exposure heating step performed as necessary) is developed (development step).

As a development method, a known method such as, e.g., a dipping method or a spray method is used. A development temperature is in a range of, e.g., 25 to 55° C. Examples of a developer that may be used include an alkaline developer.

By the development step, the photosensitive layer 11 is patterned into a pattern covering the wires 15, and exposing the head-side terminals 16 and the external terminals 17 such that the thickness of the photosensitive layer 11 in the insertion portion 5 is larger than the thickness thereof in the portions other than the insertion portion 5.

Thereafter, as shown in FIG. 3(d), the photosensitive layer 11 after the development step is cured (curing step).

To cure the photosensitive layer 11, a heating method, an exposure method, or the like is used. Preferably, the heating method is used. Heating conditions in the heating method are such that a heating temperature is in a range of 80 to 400° C., or preferably 100 to 380° C., and a heating time is in a range of, e.g., 1 minute to 2.5 hours, or preferably 5 minutes to 2 hours.

By the curing step, the photosensitive layer 11 is cured to form the insulating cover layer 9 in the foregoing pattern.

The insulating cover layer 9 thus formed has an elastic modulus at a room temperature (25° C.) in a range of, e.g., not less than 6000 N/m$^2$, or preferably not less than 6200 N/m$^2$, and normally not more than 6500 N/m$^2$.

When the elastic modulus of the insulating cover layer 9 is within the range shown above, even when the insulating cover layer 9 in the insertion portion 5 comes into contact with the E-block 30 during the insertion of the insertion portion 5 into the E-block 30, the insulating cover layer 9 can reduce a stress received from the E-block 30 by being deformed. Therefore, even when the insulating cover layer 9 in the insertion portion 5 is formed thicker than that the insulating cover layer 9 in the portions other than the insertion portion 5, it is possible to further reduce damage to the insulating cover layer 9 resulting from the contact with the E-block 30, and protect the wires 15.

In this manner, the suspension board with circuit 1 is obtained.

Next, a method of inserting the suspension board with circuit 1 obtained as described above into the E-block 30 of the hard disk drive is described with reference to FIG. 5.

The E-block 30 is provided M a head stack assembly (HSA) or the like in the hard disk drive. As shown in FIG. 5, the E-block 30 is formed of metal into, e.g., a comb-shaped cross-sectional shape, and partitioned into a plurality of spaces 31 for containing therein the suspension board with circuit 1.

To insert the suspension board with circuit 1 into the E-block 30, the insertion portion 5 of the suspension board with circuit 1 is inserted, from one widthwise end portion thereof first, into one of the spaces 31 of the E-blocks 30 along the widthwise direction of the suspension board with circuit 1, as indicated by the arrow.

In accordance with the producing method of the suspension board with circuit 1 described above, by the first exposure step and the second exposure step, the insulating cover layer 9 can be formed such that the thickness T1 thereof in the insertion portion 5 is larger than the thickness T2 thereof in the portions other than the insertion portion 5.

Additionally, since the insulating cover layer 9 can be formed such that the thickness T1 thereof in the insertion portion 5 is larger than the thickness T2 thereof in the portions other than the insertion portion 5 in the obtained suspension board with circuit 1, even when the insertion portion 5 comes into contact with the E-block 30 when the insertion portion 5 of the suspension board with circuit 1 is inserted into the E-block 30, it is possible to effectively prevent damage to the insulating cover layer 9 in the insertion portion 5, and also effectively prevent damage to the conductive pattern 8 or a broken wire therein resulting from the damage to the insulating cover layer 9.

Therefore, by mounting, in the hard disk drive, the suspension board with circuit 1 in which damage to the conductive pattern 8 in the insertion portion 5 and a broken wire therein is prevented, the reliability of the hard disk drive can be improved.

Note that it is also possible to prevent damage to the insulating cover layer 9 and the conductive pattern 8 in the insertion portion 5 by setting the thickness T1 of the insulating cover layer 9 in the insertion portion 5 to a value (of e.g., not less than 5 μm) of the same order as that of the thickness T2 thereof in the portions other than the insertion portion 5. However, in that case, the thickness T2 of the insulating cover layer 9 in the portions other than the insertion portion 5 is also large so that the spring characteristic of the entire suspension board with circuit 1 significantly varies. As a result, it is impossible to hold a minute spacing between the magnetic head and the hard disk.

By contrast, in the suspension board with circuit 1, it is possible to maintain the spring characteristic within a desired range with the insulating cover layer 9 in the portions other than the insertion portion 5 having the smaller thickness T2, while protecting the wires 15 with the insulating cover layer 9 in the insertion portion 5 having the larger thickness T1.

In the producing method described above, the exposure step is performed as the two exposure steps which are the first exposure step and the second exposure step. However, it is also possible to form the thick insulating cover layer 9 corresponding to the insertion portion 5 by performing one exposure step using, e.g., a photomask including an exposing portion, a light shielding portion, and a light semi-transmitting portion. That is, in the exposure step, the photomask is disposed such that the light semi-transmitting portion faces the portions of the photosensitive layer 11 where the insulating cover layer 9 is to be formed but other than the insertion portion 5, and exposure is performed.

However, in the case where the photomask having the light semi-transmitting portion is disposed, and exposure is performed, a state of exposure in the light semi-transmitting portion is likely to be non-uniform since a plurality of through holes (fine holes) and the like are typically formed in the light semi-transmitting portion. Accordingly, the thickness of the insulating cover layer 9 in the portions other than the insertion portion 5 corresponding to the light semi-transmitting portion is likely to be non-uniform.

However, as in the producing method described above, by sequentially performing the exposure step as the first exposure step using the first photomask 20, and the second exposure step using the second photomask 21, it is possible to uniformize the state of exposure in the portions of the photosensitive layer 11 where the insulating cover layer 9 is to be formed but other than the insertion portion 5. As a result, it is possible to reliably uniformize the thickness (T1) of the insulating cover layer 9 in the portions other than the insertion portion 5.

In the producing method described above, the photosensitive layer 11 formed at one time in the photosensitive-layer forming step is exposed to light in the two exposure steps which are the first exposure step and the second exposure step. However, as shown in FIG. 6, it is also possible to, e.g., successively form a first photosensitive layer and a second photosensitive layer, and expose the first photosensitive layer and the second photosensitive layer every time each of the photosensitive layers is formed.

Next, another embodiment of the producing method of the suspension board with circuit is described with reference to FIGS. 3 and 6. The members corresponding to the individual members described above are designated by the same reference numerals in each of FIGS. 3 and 6, and a detailed description thereof is omitted.

In the method, in the same manner as described above, the metal supporting board 6 and the insulating base layer 7 are prepared as shown in FIGS. 3(a) and 3(b) and, subsequently, the conductive pattern 8 is formed as shown in FIG. 3(c).

Next, as shown in FIG. 3(d), the insulating cover layer 9 is formed on the insulating base layer 7 so as to cover the conductive pattern 8.

To form the insulating cover layer 9, as shown in FIG. 6(a), a first photosensitive layer 12 is first formed on the insulating base layer 7 and the conductive pattern 8 (first-photosensitive-layer forming step).

A photosensitive material for forming the first photosensitive layer 12 is the same as the photosensitive material forming the photosensitive layer 11, and a formation method thereof is the same as the formation method in the photosensitive-layer forming step described above.

The first photosensitive layer 12 has a thickness in a range of, e.g., 7 to 15 µm, preferably 8 to 12 µm, or more preferably 9 to 11 µm.

Next, as shown in FIG. 6(b), a third photomask 22 is disposed on the first photosensitive layer 12, and the first photosensitive layer 12 is exposed to light via the third photomask 22 (third exposure step).

The third photomask 22 includes light shielding portions 18c which do not transmit light, and a light transmitting portion 19c which transmits light.

The third photomask 22 is disposed such that the light transmitting portion 19c faces the portion of the first photosensitive layer 12 where the insulating cover layer 9 including the insertion portion 5 is to be formed, and the light shielding portions 18c face the portions (the portions where the cover openings 10 are to be formed) of the first photosensitive layer 12 where the insulating cover layer 9 is not to be formed.

That is, the third photomask 22 is disposed such that the portion of the first photosensitive layer 12 where the insulating cover layer 9 including the insertion opening 5 is to be formed is exposed to light, and the portions (cover openings 10) of the first photosensitive layer 12 where the insulating cover layer 9 is not to be formed are shielded from light.

Subsequently, from above the third photomask 22, light is emitted toward the first photosensitive layer 12 to expose the first photosensitive layer 12 via the third photomask 22.

An exposure method and exposure conditions are the same as those in the first exposure step described above.

Next, as shown in FIG. 6(c), a second photosensitive layer 13 is formed on the first photosensitive layer 12 exposed to light by the third exposure step (second-photosensitive-layer forming step).

A photosensitive material for forming the second photosensitive layer 13 is the same as the photosensitive material forming the photosensitive layer 11, and a formation method thereof is the same as the formation method in the photosensitive-layer forming step described above.

The second photosensitive layer 13 has a thickness in a range of, e.g., 4 to 8 µm, preferably 6 to 7 µm, or more preferably 5 to 6 µm.

Next, as shown in FIG. 6(d), a fourth photomask 23 is disposed over the second photosensitive layer 13, and the second photosensitive layer 13 is exposed to light via the fourth photomask 23 (fourth exposure step).

The fourth photomask 23 is disposed over the second photosensitive layer 13 to be spaced apart therefrom.

The fourth photomask 23 includes light shielding portions 18d which do not transmit light, and a light transmitting portion 19d which transmits light.

The fourth photomask 23 is disposed such that the light transmitting portion 19d faces the portion of the second photosensitive layer 13 where the insulating cover layer 9 of the insertion portion 5 is to be formed, and the light shielding portions 18d face the portions of the second photosensitive layer 13 other than the insertion portion 5.

That is, the fourth photomask 23 is disposed such that the portion of the second photosensitive layer 13 where the insulating cover layer 9 of the insertion portion 5 is to be formed is exposed to light, and the portions of the second photosensitive layer 13 other than the insertion portion 5 are shielded from light.

Subsequently, from above the fourth photomask 23, light is emitted toward the first photosensitive layer 12 exposed to light by the third exposure step and toward the second photosensitive layer 13 exposed to light by the fourth exposure step, and exposes the first photosensitive layer 12 and the second photosensitive layer 13 via the fourth photomask 23.

An exposure method and exposure conditions are the same as those in the second exposure step shown above.

Next, in the method, the first photosensitive layer 12 exposed to light by the third exposure step and the second photosensitive layer 13 exposed to light by the fourth exposure step are subjected to post-exposure heating (post-exposure heating step).

Heating conditions for the post-exposure heating are the same as those in the post-exposure step described above.

By the third exposure step and the fourth exposure step (and the post-exposure heating step performed as necessary), the solubility of the exposed portion facing each of the light transmitting portion 19c of the third photomask 22 and the light transmitting portion 19d of the fourth photomask 23 with respect to a developer is reduced. On the other hand, only the upper parts (second photosensitive layer 13) in the thickness direction of the portions (semi-exposed portions) facing each of the light transmitting portion 19c of the third photomask 22 and the light shielding portions 18d of the fourth photomask 23 are dissolved in the subsequent development step, while the unexposed portions facing each of the light shielding portions 18c of the third photomask 22 and the light shielding portions 18d of the fourth photomask 23 are dissolved in the subsequent development steps, whereby a negative latent image is formed.

Next, as shown in FIG. 6(e), the first photosensitive layer 12 exposed to light by the third exposure step (and subjected to the post-exposure heating by the post-exposure heating step performed as necessary) and the second photosensitive layer 13 exposed to light by the fourth exposure step (and subjected to the post-exposure heating by the post-exposure heating step performed as necessary) are developed (development step).

As a development method, the same development method as described above is used.

As a result of the development step, the first photosensitive layer 12 and the second photosensitive layer 13 remain in the insertion portion 5 without being substantially dissolved. In the meantime, in the portions other than the insertion portion 5 except for the portions where the cover openings 10 are to be formed, the first photosensitive layer 12 remains without being substantially dissolved, while the second photosensitive layer 13 is dissolved and removed. On the other hand, in the portions where the insulating cover openings 10 are to be formed, the first photosensitive layer 12 and the second photosensitive layer 13 are dissolved and removed.

That is, by the development step, the first photosensitive layer 12 and the second photosensitive layer 13 each for forming the insulating cover layer 9 in the insertion portion 5 are patterned into a pattern in which the total thickness of the first photosensitive layer 12 and the second photosensitive layer 13 is larger than the thickness of the first photosensitive layer 12 for forming the insulating cover layer 9 in the portion other than the insertion portion 5.

Next, as shown in FIG. 3(d), the first photosensitive layer 12 and the second photosensitive layer 13 after the development step are cured (curing step).

As a method of curing the first photosensitive layer 12 and the second photosensitive layer 13, the same curing method as described above is used.

By the curing step, the first photosensitive layer 12 and the second photosensitive layer 13 are cured to form the insulating cover layer 9 in the foregoing pattern.

In the formed insulating cover layer 9, the insertion portion 5 is formed from the first photosensitive layer 12 and the second photosensitive layer 13, while each of the portions (except for the portions where the cover openings 10 are to be formed) other than the insertion portion 5 is formed from the first photosensitive layer 12.

In this manner, the suspension board with circuit 1 is obtained.

In accordance with the producing method of the suspension board with circuit 1 described above, the insulating cover layer 9 is formed from two photosensitive layers which are the first photosensitive layer 12 and the second photosensitive layer 13 by the first-photosensitive-layer forming step and the second-photosensitive-layer forming step. Therefore, it is possible to form the insulating cover layer 9 such that the thickness T1 thereof in the insertion portion 5 is surely larger than the thickness T2 thereof in the portions other than the insertion portion 5.

EXAMPLES

Hereinbelow, the present invention is described more specifically by showing the examples and comparative example thereof. However, the present invention is by no means limited to the examples and the comparative example.

Example 1

A metal supporting board made of stainless steel, and having a thickness of 20 μm was prepared (see FIG. 3(a)).

Then, a varnish of a polyamic acid resin solution was coated on the entire upper surface of the metal supporting board, and then heated at 130° C. to form a base coating. Thereafter, the base coating was heated to 180° C. to be dried, and then cured (imidized) by heating at 380° C. to form an insulating base layer made of polyimide, and having a thickness of 10 μm on the entire upper surface of the metal supporting board (see FIG. 3(b)).

Then, a conductive pattern having a thickness of 15 μm was formed as a wired circuit pattern integrally including head-side terminals, external terminals, and wires by an additive method (see FIG. 3(c)).

Then, an insulating cover layer was formed on the insulating base layer so as to cover the conductive pattern (see FIG. 3(d)).

That is, a polyamic acid resin and a photosensitizer were first mixed in NMP to prepare a photosensitive varnish. Then, the obtained photosensitive varnish was coated on the insulating base layer and the conductive pattern, and then heated to 130° C. to be dried to form a photosensitive layer having a thickness of 11 μm (see FIG. 4(a) showing a photosensitive-layer forming step).

Then, a first photomask was disposed over the photosensitive layer, and the photosensitive layer was exposed to light via the first photomask (see FIG. 4(b) showing a first exposure step).

That is, the first photomask including light-shielding portions and a light transmitting portion was disposed over the photosensitive layer to be spaced apart therefrom such that the light transmitting portion faced the portion of the photosensitive layer where the insulating layer of the insertion portion was to be formed, and the light shielding portions faced the portions of the photosensitive layer other than the insertion portion.

Subsequently, an ultraviolet beam was emitted from above the first photomask toward the photosensitive layer to irradiate and expose the photosensitive layer at a dose of 800 mJ/cm$^2$ via the first photomask (see FIG. 4(b)).

Then, a second photomask was disposed over the photosensitive layer exposed to light by the first exposure step, and the photosensitive layer was exposed to light via the second photomask (see FIG. 4(c) showing a second exposure step).

That is, the second photomask including light shielding portions and a light transmitting portion was disposed over the photosensitive layer to be spaced apart therefrom such that the light transmitting portion faced the portion of the photosensitive layer where the insulating cover layer including the insertion portion was to be formed, and the light shielding portions faced the portions of the photosensitive layer where cover openings were to be formed.

Subsequently, from above the second photomask, light was emitted toward the photosensitive layer exposed to light by the first exposure step, and exposed the photosensitive layer at a dose of 200 mJ/cm$^2$ via the second photomask.

Then, the exposed photosensitive layer was subjected to post-exposure heating performed at 180° C. for 1.5 minutes (post-exposure heating step).

Then, the photosensitive layer subjected to the post-exposure heating was developed by a dipping method using an alkaline developer (see FIG. 4(d) showing a development step), whereby the photosensitive layer was patterned into a pattern in which the thickness of the photosensitive layer in the insertion portion was larger than the thickness thereof in the portions other than the insertion portion, and the cover openings were formed.

Then, the developed photosensitive layer was cured (imidized) by heating performed at 380° C. for 2 hours (curing step).

In this manner, the insulating cover layer was formed in the foregoing pattern.

In the meantime, an insulating cover layer was formed separately, and the elastic modulus thereof at 25° C. was measured based on JIS K7113. The obtained elastic modulus was 6200 N/m$^2$.

The thickness (T1) of the insulating cover layer in the insertion portion was 8 μm, while the thickness (T2) thereof in the portions other than the insertion portion was 5 μm.

In this manner, the suspension board with circuit was obtained.

Example 2

A metal supporting board made of stainless steel, and having a thickness of 25 μm was prepared (see FIG. 3(a)).

Then, a varnish of a polyamic acid resin solution was coated on the entire upper surface of the metal supporting board, and then heated at 130° C. to form a base coating. Thereafter, the base coating was heated to 180° C. to be dried, and then cured (imidized) by heating at 380° C. to form an insulating base layer made of polyimide, and having a thickness of 10 μm on the entire upper surface of the metal supporting board (see FIG. 3(b)).

Then, a conductive pattern having a thickness of 15 μm was formed as a wired circuit pattern integrally including head-side terminals, external terminals, and wires by an additive method (see FIG. 3(c)).

Then, an insulating cover layer was formed on the insulating base layer so as to cover the conductive pattern (see FIG. 3(d)).

That is, a polyamic acid resin and a photosensitizer were first mixed in NMP to prepare a photosensitive varnish. Then, the prepared photosensitive varnish was coated on the insulating base layer and the conductive pattern, and then heated to 130° C. to be dried to form a first photosensitive layer having a thickness of 10.5 μm (see FIG. 6(a) showing a first-photosensitive-layer forming step).

Then, a third photomask was disposed over the first photosensitive layer, and the first photosensitive layer was exposed to light via the third photomask (see FIG. 6(b) showing a third exposure step).

That is, the third photomask including light shielding portions and a light transmitting portion was disposed over the first photosensitive layer to be spaced apart therefrom such that the light shielding portions faced the portions of the first photosensitive layer where cover openings were to be formed, and the light transmitting portion faced the portion of the first photosensitive layer where the insulating cover layer including the insertion portion was to be formed.

Then, from above the third photomask, light was emitted toward the first photosensitive layer to expose the first photosensitive layer at a dose of 400 mJ/cm$^2$ via the third photomask.

Then, the same photosensitive varnish as mentioned above was coated on the first photosensitive layer exposed to light by the third exposure step, and then heated to 130° C. to be dried to form a second photosensitive layer having a thickness of 6 μm (see FIG. 6(c) showing a second-photosensitive-layer forming step).

Then, a fourth photomask was disposed over the second photosensitive layer, and the second photosensitive layer was exposed to light via the fourth photomask (see FIG. 6(d)).

That is, the fourth photomask including light shielding portions and a light transmitting portion was disposed over the second photosensitive layer to be spaced apart therefrom such that the light transmitting portion faced the portion of the second photosensitive layer where the insulating cover layer of the insertion portion was to be formed, and the light shielding portions faced the portions of the second photosensitive layer other than the insertion portion.

Then, the first photosensitive layer exposed to light by the third exposure step and the second photosensitive layer exposed to light by the fourth exposure step were subjected to post-exposure heating performed at 180° C. for 1.5 minutes (post-exposure heating step).

Then, the first photosensitive layer and the second photosensitive layer each subjected to the post-exposure heating were developed at 50° C. by a dipping method using an alkaline developer (see FIG. 6(e) showing a development step).

In this manner, in the insertion portion, the first photosensitive layer and the second photosensitive layer were left without being substantially dissolved and, in the portions other than the insertion portion, the first photosensitive layer was left without being substantially dissolved, while the second photosensitive layer was dissolved and removed. On the other hand, in the portions where the cover openings were to be formed, the first photosensitive layer and the second photosensitive layer were dissolved and removed.

Then, the developed first and second photosensitive layers were cured (imidized) by heating performed at 380° C. for 2 hours (curing step).

In this manner, the insulating cover layer was formed in the foregoing pattern.

In the meantime, an insulating cover layer was formed separately, and the elastic modulus thereof at 25° C. was measured based on JIS K7113. The obtained elastic modulus was 6200 N/m$^2$.

The thickness (T1) of the insulating cover layer in the insertion portion was 8 μm, while the thickness (T2) thereof in the portions other than the insertion portion was 5 μm.

In this manner, the suspension board with circuit was obtained.

Comparative Example 1

A suspension board with circuit was produced in the same manner as in EXAMPLE 1 except that, in the formation of an insulating cover layer, each of the thickness (T1) thereof in the insertion portion and the thickness (T2) thereof in the portions other than the insertion portion was set to 5 μm.

That is, in the formation of the insulating cover layer, the same photosensitive varnish as mentioned above was coated on an insulating base layer and a conductive pattern, and then heated to 130° C. to be dried to form a photosensitive layer having a thickness of 11 μm (see FIG. 6(a)).

Then, a photomask including light shielding portions and a light transmitting portion was disposed over the photosensitive layer to be spaced apart therefrom such that the light shielding portions faced the portions of the photosensitive layer where cover openings were to be formed, and the light transmitting portion faced the portion of the photosensitive layer where the insulating cover layer was to be formed.

Then, an ultraviolet beam was emitted from above the photomask toward the photosensitive layer to expose the photosensitive layer at a dose of 400 mJ/cm$^2$ via the photomask (see FIG. 4(c)).

Then, the exposed photosensitive layer was subjected to post-exposure heating performed at 180° C. for 1.5 minutes.

Then, the photosensitive layer subjected to the post-exposure heating was developed at 50° C. by a dipping method using an alkaline developer.

In this manner, the photosensitive layer was patterned into a pattern in which the photosensitive layer had a uniform thickness entirely along the longitudinal direction, and cover openings were formed.

Then, the developed photosensitive layer was cured (imidized) by heating performed at 380° C. for 2 hours.

In this manner, the insulating cover layer was formed to have a uniform thickness of 5 μm entirely along the longitudinal direction, whereby a suspension board with circuit was obtained. In the meantime, an insulating cover layer was formed separately, and the elastic modulus thereof at 25° C. was measured based on JIS K7113. The obtained elastic modulus was 6200 N/m².

(Evaluation)

(Insertion of Suspension Board with Circuit into E-Block)

The insertion portion of each of the suspension boards with circuits of EXAMPLES 1 and 2 and COMPARATIVE EXAMPLE 1 was inserted into the E-block of a head stack assembly (HSA) in a hard disk drive. The height (Spacing Between Comb-Shaped Members Partitioning Space) (H) of a space in the E-block was 500 μm.

Thereafter, it was checked whether or not there was damage to the insulating cover layers in the insertion portions and to wires corresponding thereto.

As a result, in the suspension boards with circuits of EXAMPLES 1 and 2, damage to the insulating cover layers and to the wires was not recognized.

On the other hand, in COMPARATIVE EXAMPLE 1, damage to both of the insulating cover layer and the wires was recognized.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with circuit comprising:
   a metal supporting board; an insulating base layer formed on the metal supporting board;
   a conductive pattern formed on the insulating base layer;
   an insulating cover layer formed on the insulating base layer so as to cover the conductive pattern; and
   an insertion portion to be inserted into an E-block, the insertion portion being defined along an entire widthwise direction of the suspension board with circuit and having a thickness T1 of the insulating cover layer over the entire widthwise direction, and extending in a longitudinal direction of the suspension board with circuit, wherein the thickness T1 of the insulating cover layer in the insertion portion is larger than a thickness T2 of the insulating cover layer in a portion other than the insertion portion.

2. The suspension board with circuit as claimed in claim 1, wherein the insertion portion is generally rectangular in shape when viewed in a plan view.

* * * * *